United States Patent [19]

Southerland, Jr.

[11] Patent Number: 4,565,934

[45] Date of Patent: Jan. 21, 1986

[54] DYNAMIC CLOCKING SYSTEM USING SIX CLOCKS TO ACHIEVE SIX DELAYS

[75] Inventor: Ebbin R. Southerland, Jr., Houston, Tex.

[73] Assignee: Texas Instruments Incorporated, Dallas, Tex.

[21] Appl. No.: 353,672

[22] Filed: Mar. 1, 1982

[51] Int. Cl.[4] .................. H03K 19/096; H03K 5/135; H03K 5/153

[52] U.S. Cl. .................................... 307/481; 307/443; 307/453; 307/602; 307/603; 307/605

[58] Field of Search .............. 307/443, 448, 452, 453, 307/481, 482, 584, 605, 601–603; 377/105

[56] References Cited

U.S. PATENT DOCUMENTS

| | | | |
|---|---|---|---|
| 3,497,715 | 2/1970 | Yen | 307/481 |
| 3,601,627 | 8/1971 | Booher | 307/453 X |
| 3,609,392 | 9/1971 | Tetik | 307/481 X |
| 3,617,767 | 11/1971 | Booher | 307/481 |
| 3,676,709 | 7/1972 | Ducamus et al. | 307/481 |
| 4,049,979 | 9/1977 | Shieu et al. | 307/482 X |
| 4,259,595 | 3/1981 | Omori | 307/452 |

Primary Examiner—Larry N. Anagnos
Attorney, Agent, or Firm—Robert D. Marshall, Jr.; N. Rhys Merrett; Melvin Sharp

[57] ABSTRACT

A dynamic metal oxide semiconductor field effect transistor clocking circuit that includes a first circuit which in turn includes a chargeable node, precharge capability, isolation capability and discharge capability to provide an output upon the occurrence of an input. This first circuit is connected to a second circuit which also includes a chargeable node, a precharge capability, isolation capability and the first circuit discharge capability to conditionally provide a total circuit delay output upon an occurrence of an input from the first circuit with a minimum number of clocking signals.

2 Claims, 4 Drawing Figures

DYNAMIC CLOCKING SYSTEM USING SIX CLOCKS TO ACHIEVE SIX DELAYS

BACKGROUND

1. Field of the Invention

This invention relates to metal oxide field effect transistor clocking circuits and more particularly to clocking circuits to generate phase delays.

2. Description of the Prior Art

It is often required in certain microprocessor circuits to provide a circuit that produces an output after a certain number of phase delays, after an input to the circuit is received. Such circuits provide additional timing or clock signals throughout a microprocessor or microcomputer architecture. An example of one such circuit is shown in FIG. 1. The timing diagrams in FIG. 2 correspond to FIG. 1. Note that the output falls six clock phases after the input is received. The circuit in FIG. 1 illustrates the prior art solution to this problem. Requiring the clocking inputs as shown in FIG. 2. Note that for the six phase delay output, 8 clock signals are required.

The clock delay circuit in FIG. 1 includes a seven separate branches of inverters. The inverter branch 1 receives an input which is systematically clocked through branches 2 through 7 to produce the output.

SUMMARY OF THE INVENTION

In accordance with the present invention, a dynamic metal oxide semiconductor field effect transistor clocking circuit is shown. The clocking circuit includes two main circuit components. The first circuit component includes at least one chargeable node, a precharge capability, an isolation capability and a discharge capability to conditionally provide an output upon the occurrence of an input to the first circuit. The first circuit is connected to a second circuit which also includes at least one chargeable node, a precharge capability, an isolation capability and coupled to the discharge capability of the first circuit to conditionally provide an input from the first circuit.

A further embodiment of this invention includes several circuit branches connected in parallel where each circuit branch contains a chargeable node with a precharge device, a discharge device and an isolation device. The discharge device in the preferred embodiment is shown to be a combination of two devices of which one is connected to an input for the branch and the other is connected to a clocking means. The output of the branch is the output voltage of the chargeable node and is connected to the input of the next succeeding branch. Therefore, while the branches are arranged in parallel, the output of the preceding branch is connected to the input of the next branch such that the output/input connections for the branches are made in a serial fashion. The output of the circuit is the output from the node of the last serially connected circuit branch. Also in the preferred embodiment, two separate discharge clocks are provided. Each of the several branches includes either one of the discharge clocks or the isolation clock to conditionally discharge the node in the branch. By making use of the two discharge clocks and isolation clock in this manner, the circuit in the preferred embodiment can provide six delays with only six clock inputs. These six clock inputs provide all of the precharge, discharge and isolation functions for these circuit branches.

BRIEF DESCRIPTION OF THE DRAWINGS

The novel features believed characteristic of the invention are set forth in the claims. The invention itself, however, as well other features and advantages thereof will be best understood by reference to detailed descriptions which follow when read in conjunction with the accompanying drawings wherein:

DETAILED DESCRIPTION OF THE INVENTION

Figure 1:
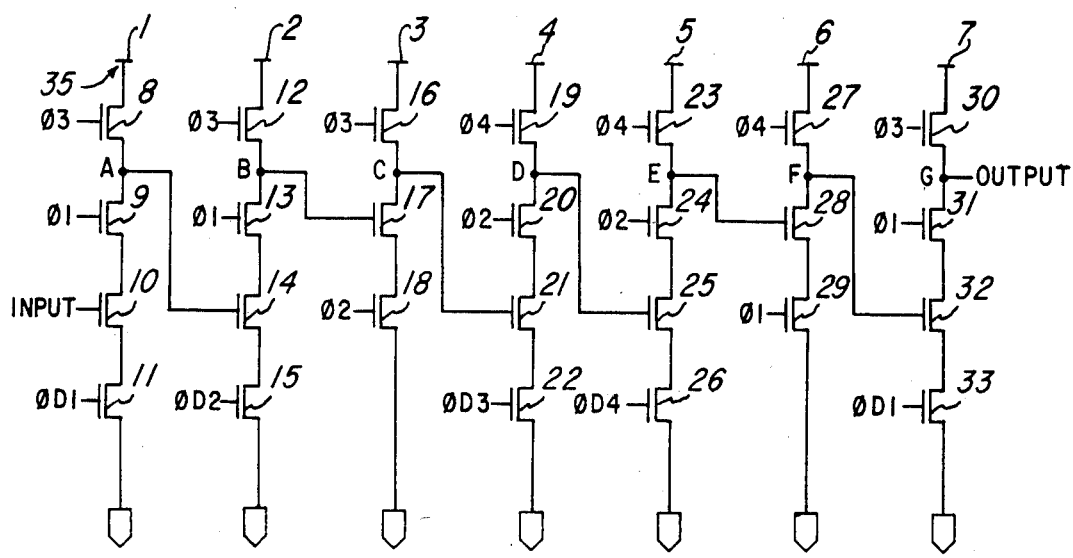
FIG. 1 is a schematic diagram of the prior art clock circuitry.
Figure 2:
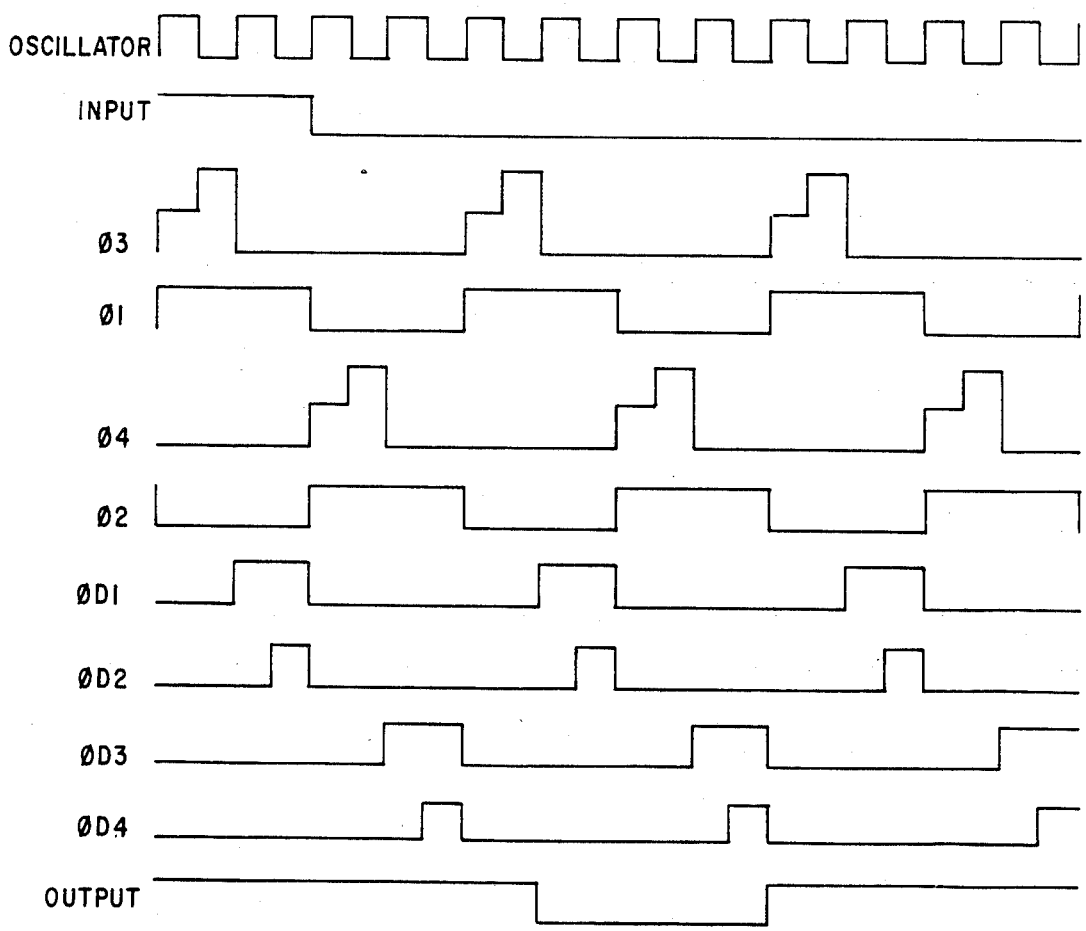
FIG. 2 is the prior art clock timing diagram for the prior art clock delay circuitry.

Prior art metal oxide semiconductor field effect transistor clock circuitry requires more clocks than resulting delays in order to produce a phase delay output from a given input. Such a circuit is illustrated in FIG. 1. The timing diagram for the clocks provided to the circuit in FIG. 1 are shown in FIG. 2. In FIG. 1, the clocking circuitry consists of 7 inverter branches. Each inverter branch in turn includes a device to precharge a node. In FIG. 1 branch 1 contains device 8 which is clocked by the signal phi 3 used to precharge node A, for example. Branch 1 is connected to Vcc at point 35. Upon the occurrence of phi 3, node A is positively charged through device 8. Note that phi 3 is a bootstrap signal, that is the voltage magnitude of the phi 3 signal is greater than Vcc. This is illustrated in FIG. 2 by the stairstepped timing pulse for phi 3. The bootstrapped signal onto the gate of device 8 allows for a minimum voltage loss across device 8 in the charging of node A from Vcc. Device 9, connected to the clocking pulse phi 1, acts as an isolating device to isolate node A from the branch input. The circuit input connected to device 10 provides for conditionally discharging of node A when the input voltage is high. Device 11 connected to device 10 receives an input from phi D1 and provides the discharge timing for branch 1. Therefore during phi 3, node A is precharged to a voltage. If the input on device 10 is high during phi 1 and during the discharge time phi D1, node A is conditionally discharged to Vss connected to branch 1 at point 34. The branch architecture for branch 1 is repeated for branches 2, 4, 5 and 7. Branch 2 is similar to branch 1 in that branch 2 contains a precharge device 12 whose gate is connected to the bootstrap clock phi 3, an isolation device 13 connected to phi 1 and an input device 14, the input to branch 2 is the output of node A in branch 1. Device 15 which discharges node B upon the occurrence of the isolation clock phi 1 and an input to device 14 during the discharge time phi D2. Note in FIG. 2, phi D2 occurs during the final portion of phi D1. Branch 3 which receives its input from branch 2, does not contain a timing discharge device as devices 11 and 15 in branches 1 and 2, respectively. Rather, branch 3 includes device 18, clocked by phi 2. Therefore branch 3 will precharge node C upon the occurrence of phi 3 through device 16 and conditionally discharge node C through the input device 17 when phi 2 becomes high. Note in FIG. 2 that phi 2 is of opposite polarity of phi 1. Therefore since branch 3 is receiving its input from the pulse being clocked through branches 1 and 2 controlled by the isolation clock phi 1 and the discharge clocks phi D1 and phi D2, the input to branch 3 will not become valid until the end of the phi 1 timing pulse. Therefore, the branch 3 outputs a three period delay of the input to branch 1. That is, an input received in branch 1 will not appear on the output of branch 3 until the first period when phi 2 is high.

Branches 4, 5, and 6 correspond to branches 1, 2 and 3 in basic architecture. However, note that devices 19, 23 and 27 which correspond to devices 8, 12 and 16 are clocked by phi 4 instead of phi 3. However, phi 4 is similar to phi 3 in that phi 4 is also a bootstrap signal to allow a minimum voltage loss across devices 19, 23 and 27 as previously discussed. Isolation devices 20 and 24 are similar to the isolation devices 9 and 13, except devices 20 and 24 are clocked by phi 2 instead of phi 1. The inputs to branches 4, 5 and 6 come from the previous branch node as before. Therefore, devices 21, 25 and 28 serve the similar functions of devices 10, 14 and 17. The main difference in branches 4, 5 and 6 from branch 1, 2 and 3 is that the discharge clocks are phi D3, phi D4 and phi 1 for branches 4, 5 and 6, respectively. Phi D3 is an input to device 22 serves the same function as phi D1 in branch 1 for device 11. Likewise phi D4 as an input to device 26 serves the same function as phi D2 does for device 15 is branch 2. Referring to FIG. 1, note that phi D3 and phi D4 are similar to phi D1 and phi D2 in pulse width and timing, except that phi D3 and phi D4 are phased after phi 4. Phi 1 in branch 6 serves the same function as phi 2 does in branch 3, to delay the discharge or the validation of the output on node F until the beginning of phi 1 which is after the occurrence of phi D3 and phi D4 in the previous branches 4 and 5. Branches 4, 5 and 6 then result in a three clock period delay similar to branches 1, 2 and 3. Branch 7 is provided to gate the output of the previous six branches. This is accomplished using a circuit architecture that is identical to that of the previous six branches. This is accomplished using a circuit architecture that is identical to branch 1. A bootstrap signal precharges node G through device 30 which is isolated from the input by device 31 clocked by phi 1. The node is conditionally discharged by the input from the previous branch 6 by device 32 and device 33 which is clocked by phi D as before. The resulting output is shown in FIG. 1 as the output waveform.

Figure 3:
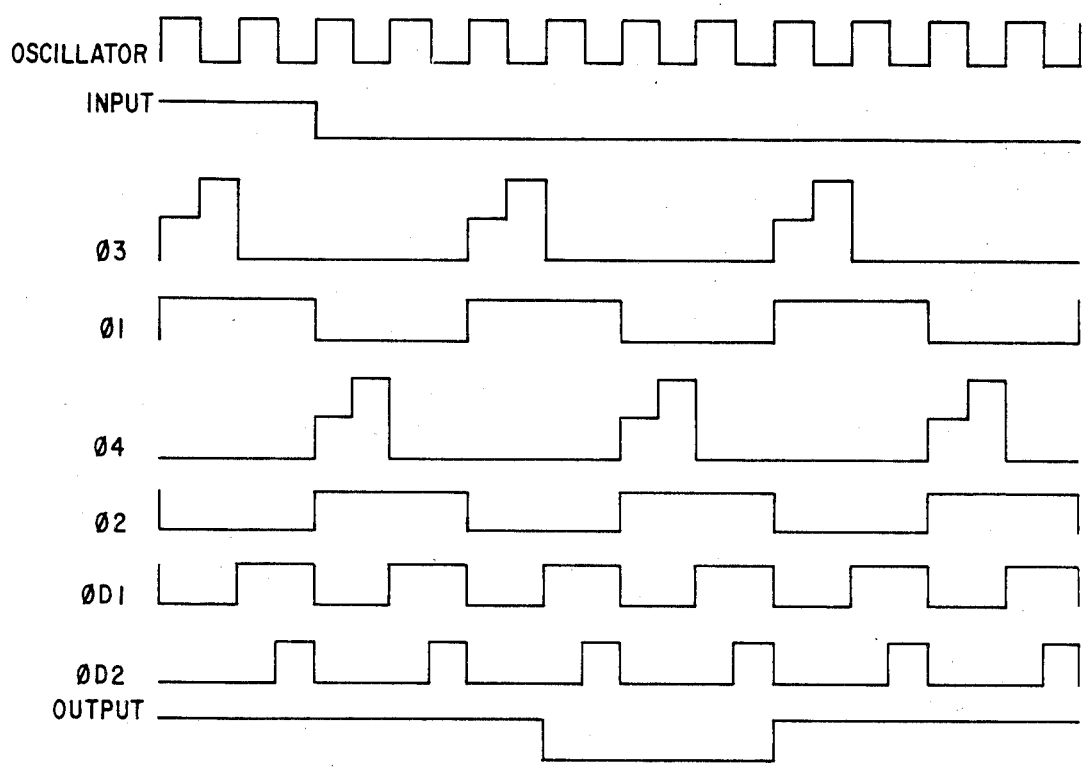
FIG. 3 is a timing diagram for the present invention.
Figure 4:
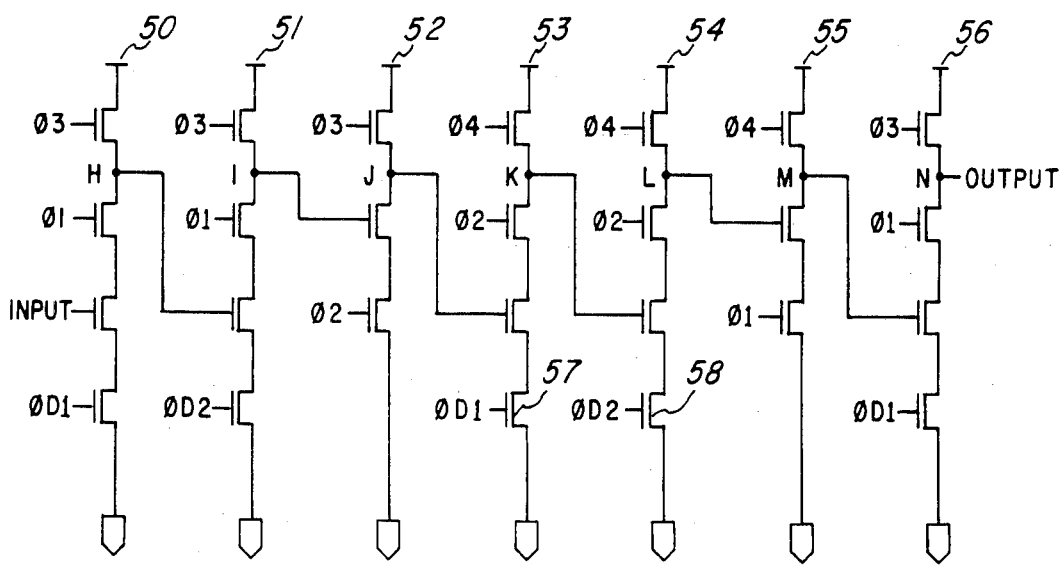
FIG. 4 is a schematic diagram of the present invention clocking circuitry.

The invention shown in FIG. 4 is similar in architecture to the prior art shown in FIG. 1 with a major difference however. This major difference is that there are only two discharge clocks, phi D1 and phi D2. The timing for the circuitry in FIG. 4 is shown in FIG. 3. Note that the FIG. 3 timing is similar to the FIG. 1 timing with the exception of phi D1, phi D2, phi D3 and phi D4. Specifically, FIG. 3 does not contain a phi D3 and phi D4. Rather, phi D1 in FIG. 3 is the combination of phi D1 and phi D3 in FIG. 1. Likewise phi D2 in FIG. 3 is the combination of phi D2 and phi D4 in FIG. 1. Therefore, branches 53 and 54 in FIG. 2 corresponding to branches 4 and 5 in FIG. 2 now receive discharge signals phi D1 into device 57 and phi D2 in device 58. This result is made possible by the fact that the preceding branch 52 is discharged by the isolation clock phi 2. Therefore, branch 52 effectively isolates the discharge clocking for branches 50 and 51 from the branches 53 and 54. The second occurrence of phi D1 and phi D2 in branches 50 and 51 will not affect the input branch 52 because the nodes H and I in branches 50 and 51, respectively, are now isolated by phi 1 from the second occurrence of phi D1 and phi D2. Likewise branch 55 isolates the timing in branches 53 and 54 from the gated output branch 56 in a similar manner. The result of this invention is that six clock phases produce six delays. This results in a savings for the circuitry that would be required to produce phi D3 and phi D4 along separate lines as shown in FIG. 1.

What we claimed is:

1. A dynamic metal oxide semiconductor field effect device clocking circuit to produce an output at a fixed time interval after receiving an input signal at an input node comprising:

a first circuit means responsive to a first precharge signal having a repetitive first active state, a first clocking signal having a repetitive active state coincident with said first active state of said first precharge signal, a second clocking signal having a repetitive active state coincident with the inactive state of said first clocking signal, a first discharge signal having an active state when neither said first precharge signal nor a second precharge signal which is noncoincident with said first precharge signal is active and a second discharge signal having an active state during a final portion of the active state of said first discharge signal, having a first input node responsive to said input signal, a first output node, a first branch connected to said first input node including a plurality of field effect devices having their source drain paths connected in series and each field effect device having a respective gate responsive to said first precharge signal, said first clocking signal, said input signal and said first discharge signal, respectively, said junction of the first branch field effect devices responsive to the first precharge signal and to the first clocking signal providing the first branch output; a second branch connected to said first branch including a plurality of field effect devices having their source drain paths connected in series and each field effect device having a respective gate responsive to said first precharge signal, said first clocking signal, the signal at said first branch output and said second discharge signal, respectively, said junction of the second branch field effect devices responsive to the first precharge signal and to the first clocking signal providing the second branch output; and a third branch connected to said second branch and providing an output on said first output node including a plurality of field effect devices having their source drain paths connected in series and each field effect device having a respective gate responsive to said first precharge signal, the signal at said second branch output and said second clocking signal, respectively, for generating an output on said first output node, at the junction of the third branch field effect devices responsive to the first precharge signal and to the signal at the second branch output, a predetermined interval after receiving an input on said first input node;

a second circuit means responsive to a second precharge signal having a repetitive second active state noncoincident with said first active state, said first clocking signal, said second clocking signal, said first discharge signal and said second discharge signal, having a second input node connected to said first output node and a second output node, a fourth branch connected to said first output node including a plurality of field effect devices having their source drain paths connected in series and each field effect device having a respective gate responsive to said second precharge signal, said second clocking signal, the signal at said first output node and said first discharge signal, respectively, said junction of the fourth branch field effect devices responsive to the second precharge signal and to the second clocking signal providing the fourth branch output; a fifth branch connected to sad fourth branch including a plurality of field effect devices having their source drain paths connected in series and each field effect device having a respective gate responsive to said second precharge signal, said second clocking signal, the signal at said fourth branch output and said second discharge signal, respectively, said junction of the fifth branch field effect devices responsive to the second precharge signal and to the second clocking signal providing the fifth branch output; and a sixth branch connected to said fifth branch and providing an output on said second output node including a plurality of field effect devices having their source drain paths connected in series and each field effect device having a respective gate responsive to said second precharge signal, the signal at sad fifth branch output and said first clocking signal, respectively, for generating an output on said second output node, corresponding to the junction of the sixth branch field effect devices responsive to the second precharge signal and to the fifth branch output, a predetermined interval after receiving an input on said second input node, thereby generating an extended delay from the signal applied to said first input node; and a third circuit means having a seventh branch connected to said second output node including a plurality of field effect devices having their source drain paths connected in series and each field effect device having a respective gate responsive to said first precharge signal, said first clocking signal, the signal at said second output node and said first discharge signal, said seventh branch connected to said second output node for isolating the output of said second output node and producing said dynamic output having said fixed delay at the junction of the seventh branch field effect devices responsive to the first precharge signal and the first clocking signal.

2. A dynamic metal oxide semiconductor field effect device clocking circuit to produce an output at a fixed time interval after receiving an input comprising:

a first circuit means responsive to a first precharge signal having a repetitive first active state, a first clocking signal having a repetitive active state coincident with said first active state of said first precharge signal, a second clocking signal having a repetitive active state coincident with the inactive state of said first clocking signal, a first discharge signal having an active state when neither said first precharge signal nor a second precharge signal which is noncoincident with said first precharge signal is active and a second discharge signal having an active state during the final portion of the active state of said first discharge signal having, a first branch having four field effect devices with sources and drains connected in series between a first potential and a second potential of the opposite polarity in the respective order which follows, said four field effect devices including a first precharge field effect device having a gate responsive to sad first precharge signal, a first isolation field effect device having a gate responsive to said first clocking signal, a first input field effect device having a gate for receiving said dynamic clocking circuit input, and a first discharge field effect device having a gate responsive to said first discharge signal, the junction between said first precharge field effect device and said first isolation field effect device being a first output node, a second branch having four field effect devices with sources and drains connected in series between said first potential and said second potential in the respective order which follows, said four field effect devices including a second precharge field effect device having a gate responsive to said first precharge signal, a second isolation field effect device having a gate responsive to said first clocking signal, a second input field effect device having a gate connected to said first output node, and a second discharge field effect device having a gate responsive to said second discharge signal, the junction between said second precharge field effect device and said second isolation field effect device being a second output node, and a third branch having three field effect devices with sources and drains connected in series between said first potential and said second potential in the respective order which follows, said three field effect devices including a third precharge field effect device having a gate responsive to said first precharge signal, a third input field effect device having a gate connected to said second output node, and a third discharge field effect device having a gate responsive to said second clocking signal, that junction between said third precharge field effect device and said third input field effect device being said first circuit output node;

a second circuit means responsive to said second precharge signal, said first and said second clocking signals, said first and said second discharge signals having, a fourth branch having four field effect devices with sources and drains connected in series between said first potential and said second potential in the respective order which follows, said four field effect devices including a fourth precharge field effect device having a gate responsive to said second precharge signal, a fourth isolation field effect device having a gate responsive to said second clocking signal, a fourth input field effect device having a gate connected to said first circuit output node, and a fourth discharge field effect device having a gate responsive to said first discharge signal, the junction between said fourth precharge field effect device and said fourth isolation field effect device being a fourth output node, a fifth branch having four field effect devices with sources and drains connected in series between said first potential and said second potential in the respective order which follows, said four field effect devices including a fifth precharge field effect device having a gate responsive to said second precharge signal, a fifth isolation field effect device having a gate responsive to said second clocking signal, a fifth input field effect device having a gate connected to said fourth output node, and a fifth discharge field effect device having a gate responsive to said second discharge signal, the junction between said fifth precharge field effect device and said fifth isolation field effect device being a fifth output node, and a sixth branch having three field effect devices with sources and drains connected in series between said first potential and said second potential in the respective order which follows, said three field effect devices including a sixth precharge field effect device having a gate responsive to said second precharge signal, a sixth input field effect device having a gate connected to said fifth output node, and a sixth discharge field effect device having a gate responsive to said first clocking signal, the junction between said sixth precharge field effect device and said sixth input field effect device being said second circuit output node; and a third circuit means responsive to said first precharge signal, said first clocking signal and said first discharge signal having four field effect devices having their drains and sources connected in series between said first potential and said second potential in the respective order which follows, said four field effect devices including a seventh precharge field effect device having a gate responsive to said first precharge signal, a seventh isolation field effect device having a gate responsive to said first clocking signal, a seventh input field effect device having a gate connected to said second circuit output node, and a seventh discharge field effect device having a gate responsive to said first discharge signal, the junction between said seventh precharge field effect device and said seventh isolation field effect device being the output of said dymanic clocking circuit.

* * * * *